US005246218A

United States Patent [19]
Yap et al.

[11] Patent Number: 5,246,218
[45] Date of Patent: Sep. 21, 1993

[54] APPARATUS FOR SECURING AN AUTOMATICALLY LOADED WAFER CASSETTE ON A WAFER PROCESSING EQUIPMENT

[75] Inventors: Hoon-Yeng Yap, Mesa; Charles H. Babcock, III, Chandler, both of Ariz.

[73] Assignee: Intel Corporation, Santa Clara, Calif.

[21] Appl. No.: 951,444

[22] Filed: Sep. 25, 1992

[51] Int. Cl.⁵ ............................................. B23Q 1/08
[52] U.S. Cl. .................................... 269/309; 269/903
[58] Field of Search ................ 29/464, 465, 559, 563, 29/271; 269/309, 310, 56, 329, 903; 198/345; 294/1.1; 414/404

[56] References Cited
U.S. PATENT DOCUMENTS

| | | | |
|---|---|---|---|
| 4,390,172 | 6/1983 | Gotman | 269/309 |
| 4,699,364 | 10/1987 | Birjvkov et al. | 269/309 |
| 4,750,857 | 6/1988 | Kochersperger | 414/404 |
| 4,762,353 | 8/1988 | Molinara | 294/1.1 |
| 4,934,680 | 6/1990 | Schneider | 269/309 |
| 5,036,579 | 8/1991 | Buchler | 269/309 |
| 5,065,991 | 11/1991 | Schneider | 269/309 |

Primary Examiner—Robert C. Watson
Attorney, Agent, or Firm—Blakely, Sokoloff, Taylor & Zafman

[57] ABSTRACT

An apparatus for holding a wafer cassette on a platform of a wafer processing system is described. The apparatus includes a first guiding member and a second guiding member. The first guiding member is mounted on the platform of the wafer processing system. The second guiding member is mounted on the platform of the wafer processing system at a corresponding position of the first guiding member. The first and second guiding members define an interior boundary within which the wafer cassette is secured. The interior boundary matches an outline of a lower portion of the water cassette. The first and second guiding members together guide the water cassette to be precisely loaded into the interior boundary defined by the first and second guiding members. When the wafer cassette is located in the interior boundary defined by the first and second guiding members, the first and second guiding members prevent the wafer cassette from moving horizontally on the platform. The first and second guiding members automatically and precisely align the wafer cassette into the interior boundary when the first and second guiding members receive the wafer cassette.

5 Claims, 5 Drawing Sheets

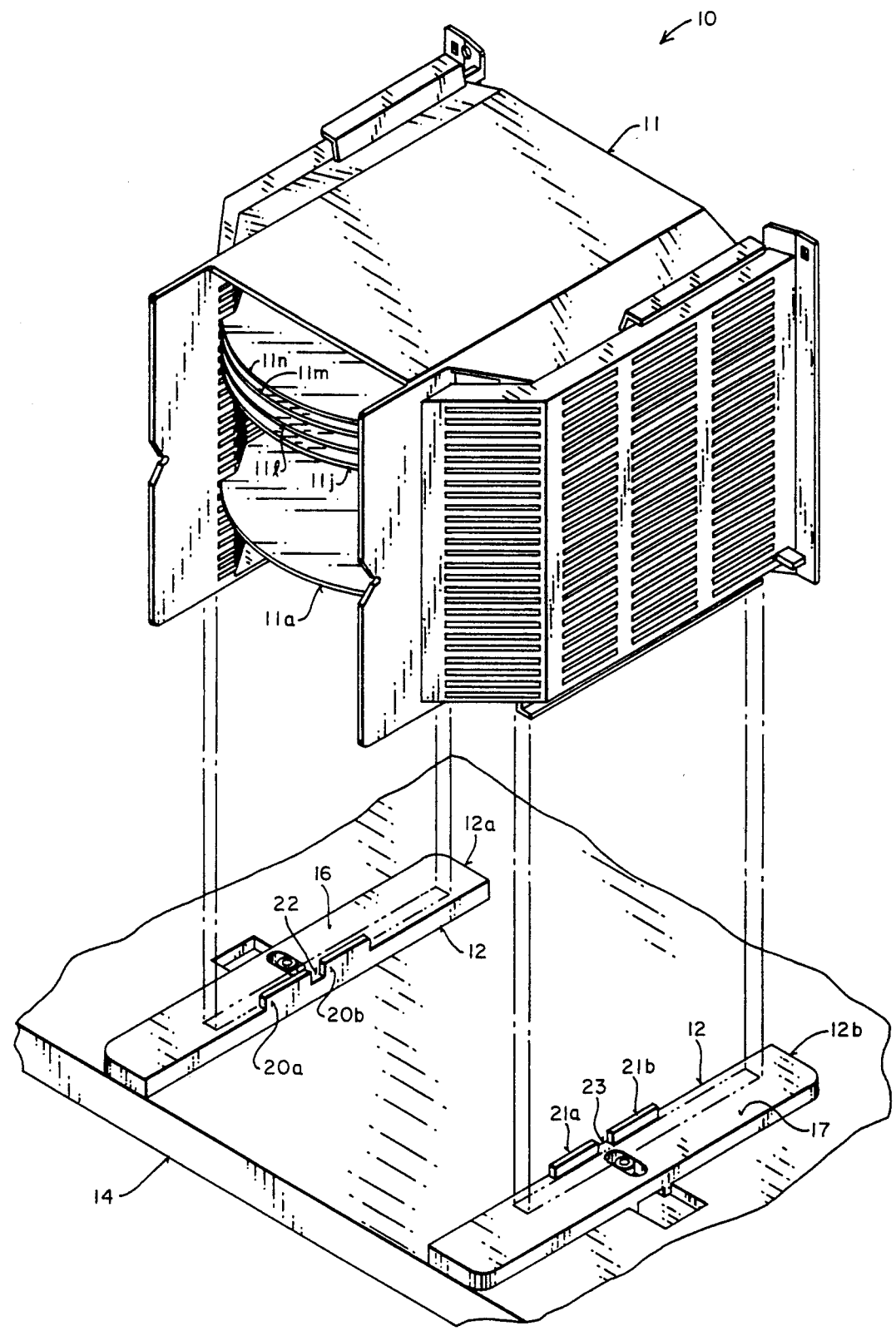
FIG_1 (PRIOR ART)

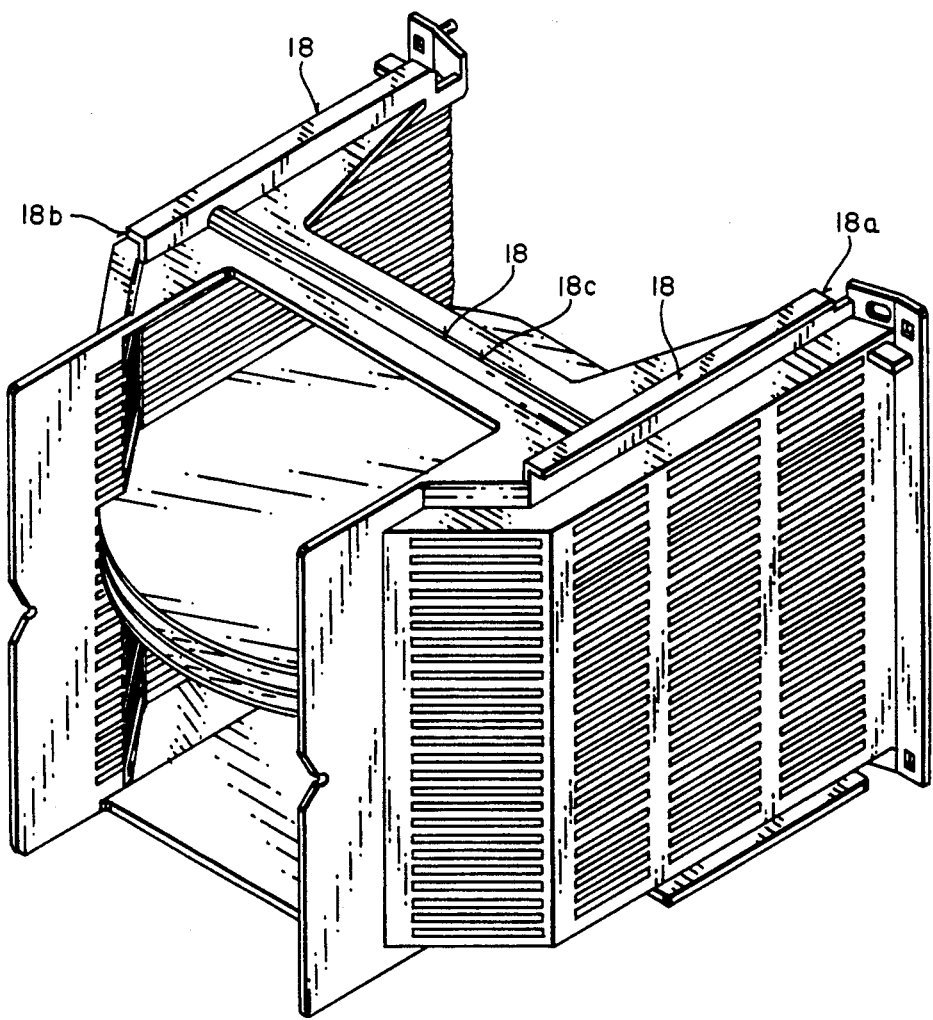
FIG_2 (PRIOR ART)

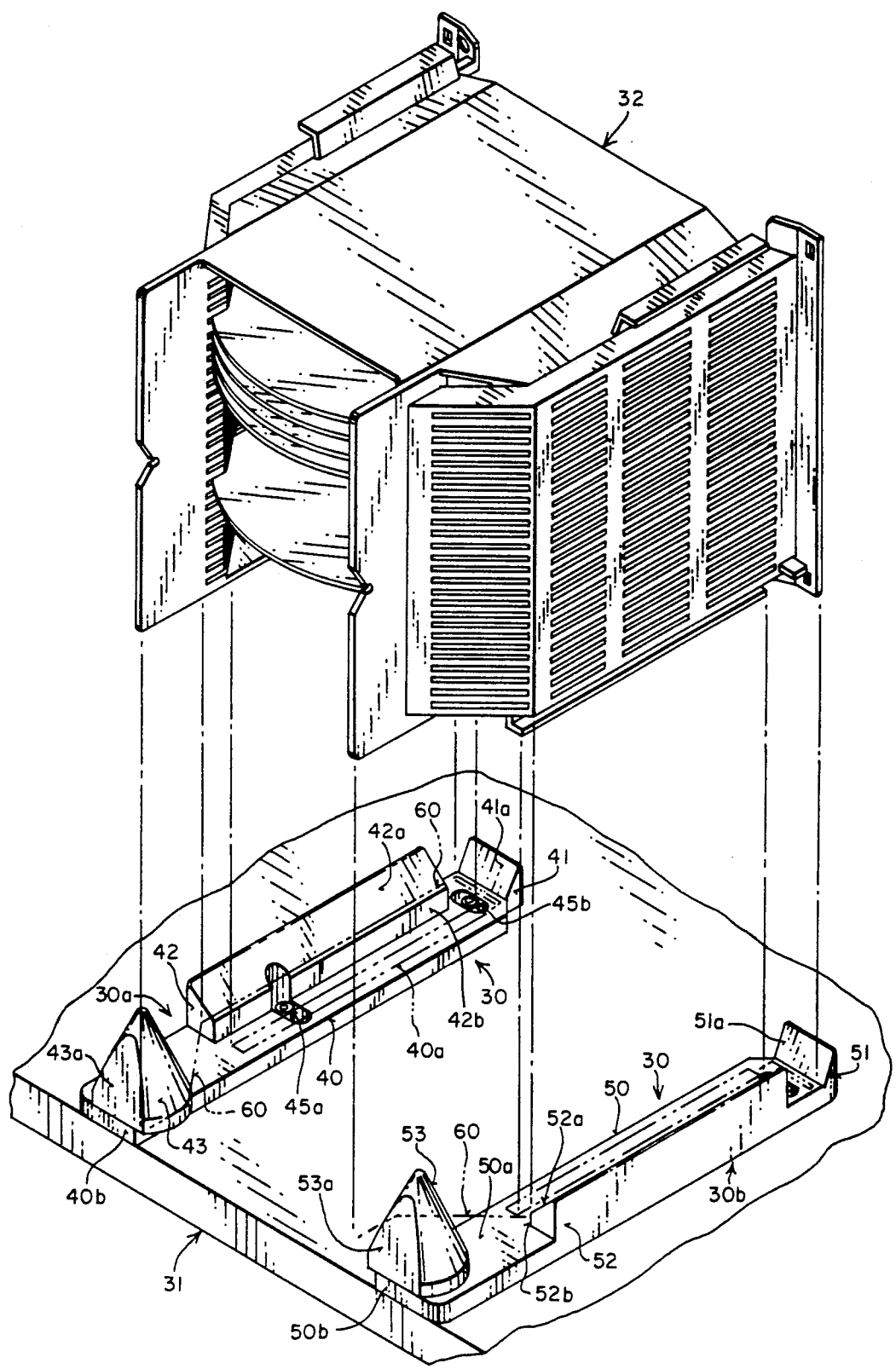

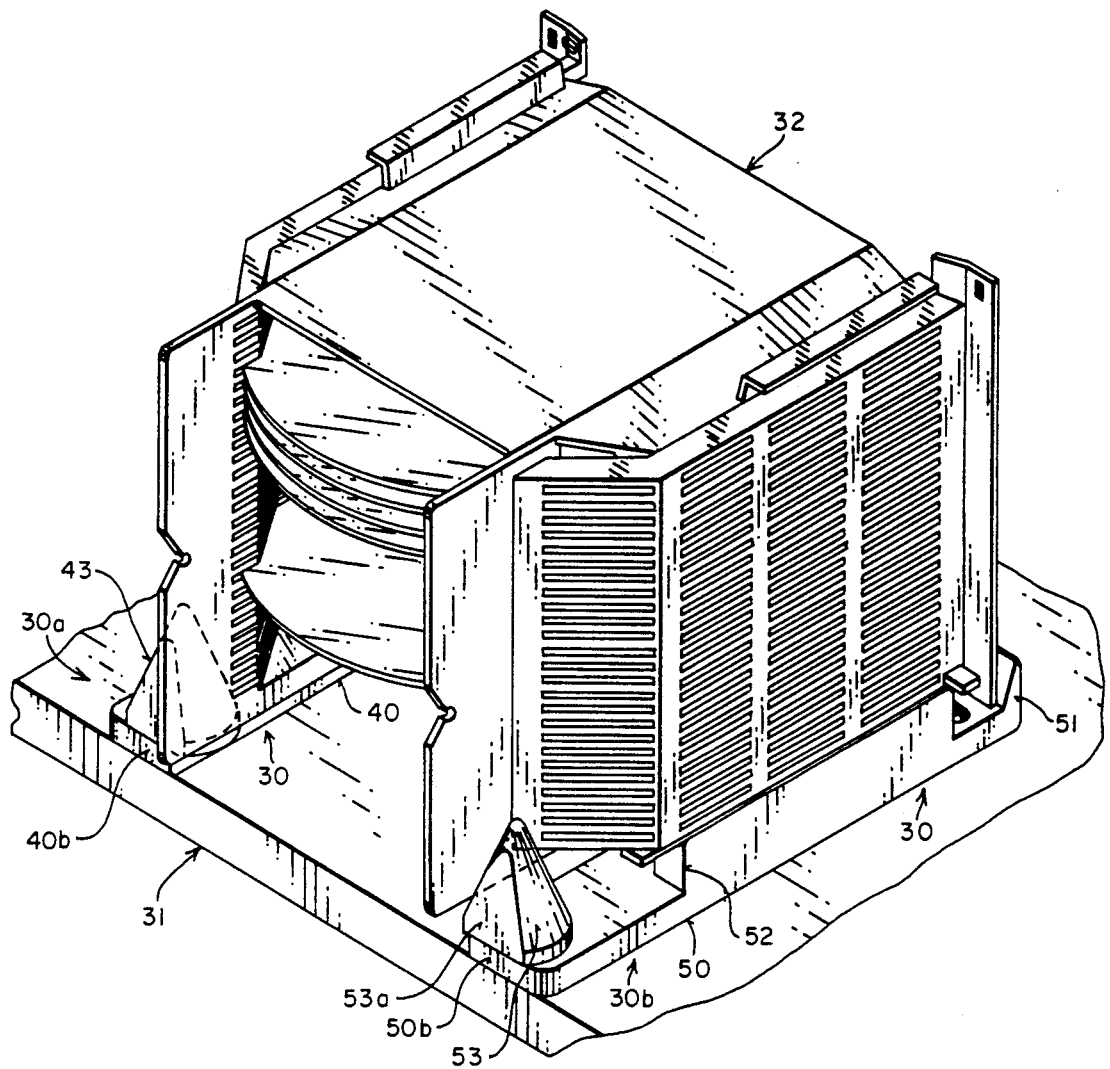
FIG_4
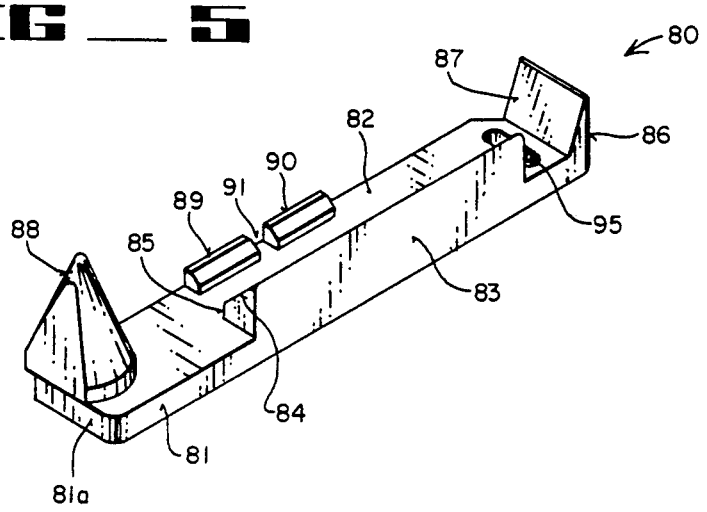
FIG_5

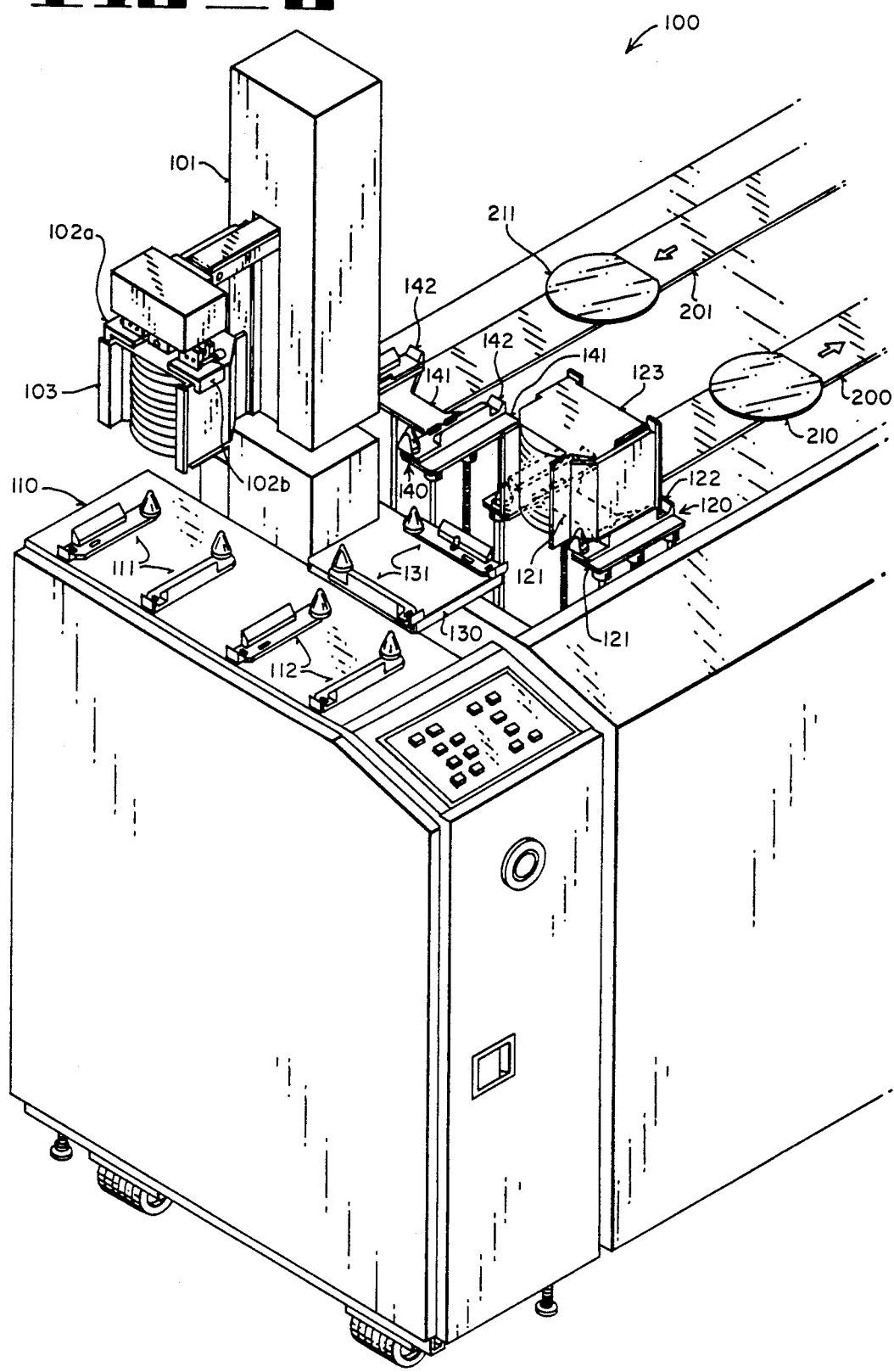
FIG_6

000
APPARATUS FOR SECURING AN AUTOMATICALLY LOADED WAFER CASSETTE ON A WAFER PROCESSING EQUIPMENT

FIELD OF THE INVENTION

The present invention pertains to the field of wafer processing equipment automation. More particularly, this invention relates to an apparatus for securing an automatically loaded wafer cassette on a wafer processing equipment, wherein the apparatus allows maximized positional displacement of the wafer cassette being loaded on the apparatus.

BACKGROUND OF THE INVENTION

In the field of integrated circuit ("IC") fabrication, one type of integrated circuits are typically fabricated on a single wafer of semiconductor substrate. Typically, the semiconductor wafer is a thin, flat and substantially circular disk of semiconducting material. The semiconductor wafer is typically from 4 to 8 inches in diameter. The wafer typically goes through a number of manufacturing phases in order to make the integrated circuits. The manufacturing phases typically include initial preparation, processing and testing.

The initial preparation typically includes steps of designing circuits, laying out the designed circuits, preparing photomasks in accordance with the circuit layout, and preparing the wafer for processing. The processing typically includes different diffusion processes to fabricate the integrated circuits. Each processing step typically employs one or more photomasks. The integrated circuits are thus fabricated on the processed wafer. The processed wafer then goes through various testing procedures.

The processing of the wafer typically require various semiconductor wafer processing equipment. The various wafer processing machines are typically separately located and the wafer being processed are typically transported from one machine to another machine by means of a wafer cassette. A wafer cassette can typically hold a number of wafers. Typically, the wafer cassette is located on a particular wafer processing machine to collect the wafers being processed by that machine. When the wafer cassette is full, the wafer cassette is removed from the machine and is transported to a next machine such that the wafers contained in the wafer cassette can receive further processing. The wafer cassette is typically mounted on the platform of the machine to supply and/or collect wafers.

The wafer cassette is typically required to be secured within a predefined target area on the platform of a wafer processing equipment such that the equipment can receive the wafers contained in the wafer cassette or forward the processed wafers to the wafer cassette. In order to secure the wafer cassette within the predefined target area on the platform, various prior art arrangements and devices have been developed. One type of prior art arrangement for securing a wafer cassette on a platform at a predefined area is illustrated in FIGS. 1 and 2.

Referring to FIGS. 1 and 2, a wafer cassette 11 is shown which is to be loaded on a wafer cassette holder 12 mounted on a platform 14 of a wafer processing equipment (not shown). FIG. 1 only shows a portion of platform 14. Wafer cassette 11 holds a number of wafers 11a through 11n. Wafer cassette 11 also includes an H-shaped bar 18 at its bottom (shown in FIG. 2). As shown in FIG. 2, H-shaped bar 18 includes two vertical bars 18a and 18b and a lateral bar 18c mounted between two vertical bars 18a and 18b.

Wafer cassette holder 12 includes two locking members 12a and 12b mounted on platform 14. Locking members 12a–12b of wafer cassette holder 12 are mounted separately platform 14 to define the predefined target area within which wafer cassette 11 is secured on platform 14. Wafer cassette 11 typically loaded on locking members 12a–12b of wafer cassette holder 12 and is secured by cassette holder 12.

Locking member 12a of wafer cassette holder 12 includes a base bar 16 that is mounted on platform 14. Locking member 12b includes a base bar 17 that is mounted on platform 14. When wafer cassette 11 is loaded on wafer cassette holder 12, each vertical bars 18a–18b of H-shaped bar 18 contacts the top surface of one of base bar 16 and 17, respectively, as shown in FIG. 1.

Locking member 12a of wafer cassette holder 12 further includes two tabs 20a and 20b located on the top surface of base bar 16. Tabs 20a–20b are spaced apart to define a notch 22 in between. Likewise, locking member 12b includes two tabs 21a and 21b located on the top surface of base bar 17. Tabs 21a–21b are spaced apart to define a notch 23 in between. The function of tabs 20a–20b and 21a–21b and notches 22–23 is to secure wafer cassette 11 on base bars 16–17, and therefore on platform 14, without horizontal movement. When wafer cassette 11 is located on wafer cassette holder 12, notches 22 and 23 are occupied by lateral bar 18c of H-shaped bar 18. When lateral bar 18c is clamped in notches 22 and 23, each vertical bars 18a–18b is held against one of two sets of tabs 20a–20b and 21a–21b, respectively. This cause H-shaped bar 18 to be free from any horizontal movement which, in turn, securely locks wafer cassette 11 on wafer cassette holder 12 without horizontal movement.

Disadvantages are, however, associated with this prior approach. One disadvantage associated is that a very small positional displacement of the wafer cassette is allowed during the loading of the wafer cassette on the wafer cassette holder. In order to lock the wafer cassette on the wafer cassette holder, the lateral bar of the H-shaped bar needs to be precisely aligned with the notches when the wafer cassette is loaded. The precise alignment of the lateral bar with the notches during the cassette loading typically requires manual operation by human operators. This typically increases the loading time of the wafer cassette which, in turn, reduces the total throughput of the processing equipment. In addition, the manual loading of the wafer cassette creates ergonomics problems.

Moreover, the precise alignment of the lateral bar with the notches during the cassette loading typically increases the cost to automate the loading of the wafer cassette. When loading and unloading of the wafer cassette is done automatically by a robotical arm, the robotical arm is required to have a high degree of accuracy. This typically increases the manufacturing cost of the robotical arm.

SUMMARY AND OBJECTS OF THE INVENTION

One of the objects of the present invention is to provide an apparatus for securing an automatically loaded wafer cassette on a wafer processing equipment.

Another object of the present invention is to provide an apparatus for securing an automatically loaded wafer cassette on a wafer processing equipment, wherein the apparatus minimizes the loading time of the wafer cassette on the wafer processing equipment, thus increasing the throughput of the equipment.

Another object of the present invention is to provide an apparatus for securing an automatically loaded wafer cassette on a wafer processing equipment, wherein the apparatus minimizes the cost of automatic loading of the wafer cassette on the wafer processing equipment.

Another object of the present invention is to provide an apparatus for securing an automatically loaded wafer cassette on a water processing equipment, wherein the apparatus allows maximized positional displacement of the wafer cassette being loaded.

A further object of the present invention is to provide an apparatus for securing an automatically loaded wafer cassette on a wafer processing equipment, wherein the apparatus minimizes the frequency of error loading of the wafer cassette.

An apparatus for holding a wafer cassette on a platform of a wafer processing system is described. The apparatus includes a first guiding member and a second guiding member. The first guiding member is mounted on the platform of the wafer processing system. The second guiding member is mounted on the platform of the wafer processing system at a corresponding position of the first guiding member. The first and second guiding members define an interior boundary within which the wafer cassette is secured. The interior boundary matches an outline of a lower portion of the wafer cassette. The first and second guiding members together guide the wafer cassette to be precisely loaded into the interior boundary defined by the first and second guiding members. When the wafer cassette is located in the interior boundary defined by the first and second guiding members, the first and second guiding members prevent the wafer cassette from moving horizontally on the platform. The first and second guiding members automatically and precisely align the wafer cassette into the interior boundary when the first and second guiding members receive the wafer cassette.

An apparatus for securing an automatically loaded wafer cassette on a platform of a wafer processing system within an interior boundary is also described. A first guiding member and a second guiding member are mounted on the platform. The first guiding member includes a first base bar having a first front end and a first rear end, a first front wall mounted on the first base bar near the first front end, a first side wall mounted in a middle portion of the first base bar, and a first rear guiding member mounted on the first base bar near the first rear end. The top surface of the first front wall is bevelled inwardly towards the interior boundary. The top surface of the first side wall is bevelled inwardly towards the interior boundary. The second guiding member includes a second base bar having a second front end and a second rear end, a second front wall mounted on the second base bar near the second front end, a second side wall mounted in a middle portion of the second base bar, and a second rear guiding member mounted on the second base bar near the second rear end. The top surface of the second front wall is bevelled inwardly towards the interior boundary. The top surface of the second side wall is bevelled inwardly towards the interior boundary. The first front wall, the first side wall, and the first rear guiding member of the first guiding member and the second front wall, the second side wall, and the second rear guiding member of the second guiding member define the interior boundary within which the wafer cassette is secured. The interior boundary matches an outline of a lower portion of the wafer cassette. The first front wall, the first side wall, and the first rear guiding member of the first guiding member and the second front wall, the second side wall, and the second rear guiding member of the second guiding member guide the wafer cassette to be precisely loaded into the interior boundary. When the wafer cassette is located in the interior boundary, the first front wall, the first side wall, and the first rear guiding member of the first guiding member and the second front wall, the second side wall, the second rear guiding member of the second guiding member prevent the wafer cassette from moving horizontally on the platform. The first front wall, the first side wall, and the first rear guiding member of the first guiding member and the second front wall, the second side wall, and the second rear guiding member of the second guiding member automatically and precisely align the wafer cassette into the interior boundary when the first and second guiding member receive the wafer cassette.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a perspective view of the prior art wafer cassette holder for securing a wafer cassette on a platform of a wafer processing equipment, including two receiving and securing members mounted on the platform;

FIG. 2 is a perspective view of the wafer cassette of FIG. 1 in an upside down position, illustrating an H-shaped bar on the bottom that engages the wafer cassette with the two receiving and securing members of the cassette holder of FIG. 1;

FIG. 3 is a perspective view of a wafer cassette holder for securing a wafer cassette on a platform of a wafer processing equipment according to a preferred embodiment of the present invention, wherein the cassette holder includes two guiding members mounted on the platform;

FIG. 4 is another perspective view showing the wafer cassette being secured on the wafer cassette holder of FIG. 3;

FIG. 5 is a perspective view of a guiding member of the cassette holder according to another preferred embodiment;

FIG. 6 illustrates the use of the wafer cassette holder of FIG. 3 in a wafer processing equipment.

DETAILED DESCRIPTION

FIG. 3 is a perspective view of a wafer cassette holder 30 mounted on a platform 31 of a wafer processing equipment (not shown) for holding and securing a wafer cassette 32 on platform 31 within a predefined target area 60, according to one preferred embodiment of the present invention. FIG. 4 is another perspective view showing wafer cassette 32 being loaded on wafer cassette holder 30 on platform 31.

In one embodiment, wafer cassette 32 holds wafers, each of which is 4 inches in diameter. In another embodiment, wafer cassette 32 holds wafers, each of which is 6 inches in diameter. Alternatively, wafer cassette 32 holds wafers, each of which has a diameter that can be larger or smaller than 4 inches. For example, each the wafers contained in wafer cassette 32 is 8 inches in diameter.

Referring to FIGS. 3 and 4, wafer cassette holder 30 includes two guiding members 30a and 30b. Guiding members 30a-30b are mounted separately on platform 31 of the wafer processing equipment (not shown) to define predefined target area 60 within which wafer cassette 32 is located on platform 31. The predefined target area 60 is located between guiding members 30a-30b. When guiding members 30a-30b are mounted on platform 31, wafer cassette 32 is loaded on guiding members 30a-30b.

As can be seen from FIG. 3, both guiding members 30a-30b of cassette holder 30 are screw-mounted on platform 31. Alternatively, guiding members 30a-30b can be mounted on platform 31 using many other conventional mounting methods. These methods typically include pressure fitting, welding, spot welding, riveting, and brazing. In addition, guiding members 30a and 30b can be integrally cast with platform 31.

Guiding members 30a-30b of cassette holder 30 are made from stainless steel. Alternatively, guiding members 30a-30b can be made from other materials.

Guiding member 30a includes a base bar 40 that is screw-mounted on platform 31. Base bar 40 is mounted by screws 45a and 45b, as shown in FIG. 3. Guiding member 30a also includes a side wall 42 on a top surface 40a of base bar 40. As shown in FIG. 3, side wall 42 is located along one side edge of base bar 40. Side wall 42 has a top surface 42a that is bevelled inwardly towards the predefined target area 60 between guiding members 30a-30b.

Guiding member 30a also includes a front wall 41 on top surface 40a of base bar 40. As shown in FIG. 3, front wall 41 is located near a front end of base bar 40. The top surface 41a of front wall 41 is also bevelled inwardly towards the predefined target area 60.

In the presently preferred embodiment, side wall 47, front wall 41, and base bar 40 are cast into an integrated member. In alternative embodiments, both side wall 42 and front wall 41 can be mounted on base bar 40 using conventional mounting methods. As described above, these mounting methods typically include screw-mounting, pressure fitting, welding, spot welding, riveting, and brazing.

Both side wall 42 and front wall 41 are made from stainless steel in the presently preferred embodiment. Alternatively, front wall 41 and side wall 42 can be made of other materials.

In the presently preferred embodiment, side wall 42 also includes an inner side surface 42b that intersects with top surfaces 40a and 42a. In an alternative embodiment, top surface 42a is so bevelled that top surface 42a is extended to intersect with top surface 40a of base bar 40 and side wall 42 does not include side surface 42b.

In the presently preferred embodiment, top surface 41a of front wall 41 is so bevelled that it intersects with top surface 40a of base bar 40. In an alternative embodiment, top surface 41a of front wall 41 does not contact top surface 40a of base bar 40 and front wall 41 includes an inner side surface.

Guiding member 30a also includes a rear guider 43 mounted near a rear end of base bar 40. In one preferred embodiment, rear guider 43 is a cone-shaped guider, as shown in FIGS. 3 and 4. In another preferred embodiment, rear guider 43 is a dome-shaped guider. In a further preferred embodiment, rear guider 43 is a pyramid-shaped guider. In alternative embodiments, rear guider 43 can be of any other shapes. For example, rear guider 43 can be a rear wall with its top surface bevelled inwardly.

The this top end of rear guider 43 can be cut off to form a flat top surface when rear guider 43 is a cone-shaped rear guider. In this case, a screw can be used to mount rear guider 43 on base bar 40 from the top surface. Similarly, rear guider 43 can be a dome-shaped rear guider with its top end cut off to from a flat top surface. Likewise, when rear guider 43 is a pyramid-shaped guider, the top end of rear guider 43 can also be cut off.

Rear guider 43 can be mounted on base bar 40 using the above described conventional mounting methods. Alternatively, rear guider 43 can be integrally cast with base bar 40.

Rear guider 43 can be screw-mounted from the top end of the guider, or from the bottom end of the guider.

As shown in FIGS. 3 and 4, rear guider 43 includes a flat side surface 43a which is aligned with end surface 40b of the rear end of base bar 40. Flat side surface 43a is formed by cutting a portion of rear guider 43 away. Alternatively, rear guider 43 does not have that flat side surface. In the presently preferred embodiment, rear guider 43 is made form stainless steel. Alternatively, rear guider 43 can be made from other materials.

Guiding member 30b, like guiding member 30a, includes a base bar 50 that is screw-mounted on platform 31. FIGS. 3 and 4 do not show the screws that mount base bar 50 onto platform 31. Guiding member 30b also includes a side wall 52 on a top surface 50a of base bar 50. As shown in FIGS. 3 and 4, side wall 52 is located along one side edge of base bar 50. Side wall 52 has a top surface 52a that is bevelled inwardly towards the predefined target are 60 between guiding members 30a-30b.

Guiding member 30b also includes a front wall 51 on the top surface 50a of base bar 50. As shown in FIG. 3, front wall 51 is located near a front end of base bar 50. The top surface 51a of front wall 51 is also bevelled inwardly towards the predefined target area 60.

In the presently preferred embodiment, side wall 52, front wall 51, and base bar 50 are cast into an integrated member. In alternative embodiments, both side wall 52 and front wall 51 can be mounted on base bar 50 using the above mentioned conventional mounting methods. Like side wall 42 and front wall 41 of guiding member 30a, side wall 52 and front wall 51 of guiding member 30b are made from stainless steel.

In the presently preferred embodiment, side wall 52 also includes an inner side surface 52b that intersects with top surfaces 50a and 52a. In an alternative embodiment, top surface 52a is so bevelled that it is extended to intersect with top surface 50a of base bar 50 and side wall 52 does not include side surface 52b.

In the presently preferred embodiment, top surface 51a of front wall 51 is so bevelled that is intersects with top surface 50a of base bar 50. In an alternative embodiment, top surface 51a of front wall 51 does not contact the top surface 50a of base bar 50 and front wall 51 includes an inner side surface.

Front walls 41 and 51 should be adequately high to guide and secure wafer cassette 32 within the predefined target area 60 when wafer cassette 32 is loaded on cassette holder 30. Yet, the height of front walls 41 and 51 should be such that they will not block the pathway for wafers to enter or exit wafer cassette 32.

Guiding member 30b includes a rear guider 53 mounted near a rear end of base bar 50. In one preferred embodiment, rear guider 53 is a cone-shaped guider, as shown in FIGS. 3 and 4. In another preferred embodiment, rear guider 53 is a dome-shaped guider. In a further preferred embodiment, rear guider 53 is a pyramid-shaped guider. In alternative embodiments, rear guider 53 can be of any other shapes. For example, rear guider 53 can be a rear wall with its top surface bevelled inwardly.

The thin top end of rear guider 53 can be cut off to form a flat top surface when rear guider 53 is a cone-shaped rear guider. In this case, a screw can be used to mount rear guider 53 on base bar 50 from the top flat surface. Similarly, rear guider 53 can be a dome-shaped rear guider with its top end cut off. Likewise, when rear guider 53 is a pyramid-shaped guider, the top end of rear guider 43 can also be cut off.

Rear guider 53 can be mounted on base bar 50 using the above mentioned conventional mounting methods. In addition, rear guider 53 can be integrally cast with base bar 50. When the screw-mounting method is used to mount rear guider 53, rear guider 53 can be mounted from its top end or from its bottom end.

As shown in FIGS. 3 and 4, rear guider 53 includes a flat side surface 53a which is aligned with end surface 50b of the rear end of base bar 50. Flat surface 53a is formed by cutting a potion of rear guider 53 away. Alternatively, rear guider 53 does not have that flat side surface. Rear guider 53, like rear guider 43, is made from stainless steel.

In one preferred embodiment, either of base bars 40 and 50 includes a slot within which a light sensor can be located. The light sensor detects whether light can shine into the slot, therefore detecting the presence of wafer cassette on cassette holder. Alternatively, other detecting devices can be used to detect the presence of wafer cassette 32 on cassette holder 30.

As shown in FIGS. 3 and 4, wafer cassette 32 is located on base bars 40 and 50 of guiding members 30a–30b of cassette holder 30, respectively, when loaded on cassette holder 30. Therefore, front wall 41, side wall 42, and rear guider 43 of guiding member 30a and front wall 51, side wall 52, and rear guider 53 of guiding member 30b together define the predefined target area 60 within which wafer cassette 32 is secured. The predefined target area 60 defined by front walls 41 and 51, side walls 42 and 52, and rear guiders 43 and 53 matches the outline of the lower portion of wafer cassette 32. When wafer cassette 32 is loaded into the predefined target area 60, front walls 41 and 51, side walls 42 and 52, and rear guiders 43 and 53 secure wafer cassette 32 on wafer cassette holder 30 and therefore on platform 31 without horizontal movement. This is due to the reason that the predefined target are 60 is fenced by front walls 41 and 51, side walls 42 and 52, and rear guiders 43 and 53.

The bevelled top surface 41a of front wall 41, the bevelled top surface 42a of side wall 42, the bevelled top surface 51a of front wall 51, the bevelled top surface 52a of side wall 52, and the cone-shaped rear guiders 43 and 53 also form a funnel-like periphery on top of the predefined target area 60. The purpose of the funnel-like periphery formed by the bevelled top surfaces 41a, 42a, 51a, and 52a, and cone-shaped rear guiders 43 and 53 is to guide the loading of wafer cassette 32 into the predefined target area 60 precisely. When wafer cassette 32 is loaded onto the funnel-like periphery, the bevelled top surfaces 41a, 42a, 51a, and 52a, and the cone-shaped rear guiders 43 and 53 then precisely guide wafer cassette 32 into the predefined target area 60. In addition, the funnel-like periphery formed by the bevelled top surfaces 41a, 42a, 51a, and 52a, and the cone-shaped rear guiders 43 and 53 provides a larger loading area for wafer cassette 32. When wafer cassette 32 is being loaded into the predefined target are 60, cassette 32 can be loaded onto the periphery and then guided into the predefined target are 60. Because the funnel-like periphery is larger than the predefined target area 60, it makes the loading of wafer cassette 32 much easier.

Moreover, the funnel-like periphery formed by the bevelled top surfaces 41a, 42a, 51a, and 52a, and the cone-shaped rear guiders 43 and 53 also allows a relatively large positional displacement of wafer cassette 32 being loaded. When wafer cassette 32 is being loaded into the predefined target area 60, cassette 32 needs not be precisely aligned with the predefined target area 60. Wafer cassette 32 can be automatically self-aligned into the predefined target area 60. This is due to the bevelled top surfaces 41a, 42a, 51a, and 52a, and the bevelled surfaces of rear guiders 43 and 53. When wafer cassette 32 is landed on any of the top surfaces 41a, 42a, 51a, and 52a, and the surfaces of rear guiders 43 and 53, wafer cassette 32 is automatically slid into the predefined target area 60 due to the natural gravity force of cassette 32. In this case, a less accurate robotical arm can be employed to perform the automatical loading of water cassette 32.

In one preferred embodiment, wafer cassette holder 30 provides with ±0.5 inches of positional error tolerance. This means that wafer cassette 32 can be loaded on cassette holder 30 with maximum ±0.5 inches positional error at all sides and still is able to be secured by cassette holder 30. In alternative embodiments, positional error tolerance can be larger or smaller than ±0.5 inches, depending on the size of cassette holder 30. The large positional error tolerance provided by cassette holder 30 allows the use of less accurate robotical arm to perform automatic loading and unloading of wafer cassette 32, which reduces the automation cost of the wafer cassette loading.

In one preferred embodiment, a lateral base bar (not shown) is provided between base bars 40 and 50. The lateral base bar is connected to base bars 40 and 50. In another preferred embodiment, wafer cassette holder 30 does not include the lateral base bar that connects base bars 40 and 50. FIG. 3 illustrates this embodiment.

In the embodiment in which the lateral base bar connects base bars 40 and 50, a female H-shaped slot is formed on base bars 40 and 50 and the lateral base bar. When wafer cassette 32 is secured on cassette holder 30, the H-shaped bar on the bottom of wafer cassette 32 is clamped into the female H-shaped slot on base bars 40 and 50 and the lateral base bar that connect between base bars 40 and 50.

In one preferred embodiment, front wall 41, side wall 42, and rear guider 43 are mounted on base bar 40 and front wall 51, side wall 52, and rear guider 53 are mounted on base bar 50. In this embodiment, the predefined target area 60 can be adjusted by re-positioning (1)

front wall 41, side wall 42, and rear guider 43 on base bar 40 and (2) front wall 51, side wall 52, and rear guider 53 on base bar 50 such that the predefined target area 60 can accommodate wafer cassette 32 of various sizes. In other words, when front walls 41 and 51, side walls 42 and 52, and rear guiders 43 and 53 are mounted on base bars 40 and 50, respectively, to define the predefine target area 60 for a four inch wafer cassette 32, the position of front walls 41 and 51, side walls 42 and 52, and rear guiders 43 and 53 can be adjusted on base bars 40 and 50 to define the predefined target area 60 for a six inch wafer cassette or an eight inch wafer cassette, etc.

FIG. 5 is a perspective view of a guiding member 80 of a wafer cassette holder, according to another preferred embodiment. In FIG. 5, guiding member 80 is one of two guiding members of a wafer cassette holder. Guiding member 80 is identical to guiding member 30b of wafer cassette holder 30 of FIGS. 3 and 4, except that guiding member 80 includes two tabs 89 and 90 on a base bar 81. An additional difference is that a rear guider 88 of guiding member 80 is not cut to form a flat side surface that is aligned with an end surface 81a of base bar 81.

Referring to FIG. 5, a front wall 86 is located at the front end of base bar 81 and a rear guider 88 is located at the rear end of base bar 81. Tabs 89-90 are located on a top surface 82 of base bar 81 in a middle portion. Tabs 89 and 90 are located in parallel with a side wall 983. Tabs 89-90 are spaced apart to form a notch 91 in between. When a wafer cassette is loaded on a cassette holder having guiding member 80, the H-shaped bar on the bottom of that wafer cassette is clamped in notch 91 between tabs 89-90.

FIG. 6 illustrates the application of wafer cassette holder 30 of FIGS. 3 and 4 in a wafer processing equipment 100. In FIG. 6, wafer processing equipment 100 includes a platform 110 on which two wafer cassette holders 111 and 112 are mounted. A robotical arm 101 has two claws 102a and 102b that can grasp a wafer cassette 103. When claws 102a and 102b grasp a wafer cassette, robotical arm 101 can lift the wafer cassette and move and load the cassette onto other places on wafer processing equipment 100.

Processing equipment 100 also includes an elevated platform 130 on which another wafer cassette holder 131 is mounted. Elevated platform 130 is higher than platform 110. Processing equipment 100 also includes two elevators 120 and 140. Each of elevators 120 and 140 includes one of platforms 121 and 141, respectively. A wafer cassette holder 122 is mounted on platform 121 of elevator 120. A wafer cassette holder 142 is mounted on platform 141 of elevator 140. A wafer cassette 123 is loaded on wafer cassette holder 122.

Wafer processing equipment 100 also includes two conveying belts 200 and 201 for conveying wafers to and from the wafer cassettes located on elevators 120 and 140, respectively. Conveying belt 200 is aligned with wafer cassette 123 located on wafer cassette holder 122 of elevator 120. Conveying belt 201 is aligned with the wafer cassette locate on wafer cassette holder 142 of elevator 140. During operation, robotical arm 101 loads wafer cassettes among cassette holders 11-112, 122-131, and 142. When a wafer cassette is loaded on one of elevators 120 and 140, that elevator moves up and down to supply wafers to its respective conveying belt or collect wafers from its respective conveying belt.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for holding a wafer cassette on a platform of a wafer processing system within an interior boundary, comprising:
   (A) first guiding means mounted on the platform of the wafer processing system, wherein the first guiding means comprises
      (i) a first base bar having a first front end and a first rear end;
      (ii) a first front wall mounted on the first base bar near the first front end, wherein a top surface of the first front wall is bevelled inwardly towards the interior boundary;
      (iii) a first side wall mounted in a middle portion of the first base bar, wherein a top surface of the first side wall is bevelled inwardly towards the interior boundary; and
      (iv) a first rear guiding member mounted on the first base bar near the first rear end, wherein the first rear guiding member has a side surface bevelled inwardly towards the interior boundary;
   (B) second guiding means mounted on the platform of the wafer processing system at a predetermined corresponding position of the first guiding means, wherein the second guiding means comprises
      (i) a second base bar having a second front end and a second rear end;
      (ii) a second front wall mounted on the second base bar near the second front end, wherein a top surface of the second front wall is bevelled inwardly towards the interior boundary;
      (iii) a second side wall mounted in a middle portion of the second base bar, wherein a top surface of the second side wall is bevelled inwardly towards the interior boundary; and
      (iv) a second rear guiding member mounted on the second base bar near the second rear end, wherein the second rear guiding member has a side surface bevelled inwardly towards the interior boundary, wherein the bevelled top and side surfaces of the first front wall, the first side wall, and the first rear guiding member of the first guiding means and the bevelled top and side surfaces of the second front wall, the second side wall, and the second rear guiding member of the second guiding means define the interior boundary within which the wafer cassette is secured, wherein the interior boundary matches an outline of a lower portion of the wafer cassette, wherein the interior boundary is within the bevelled top and side surfaces of the first and second front walls, the first and second side walls, and the first and second rear guiding members, wherein the first front wall, the first side wall, and the first rear guiding member of the first guiding means and the second front wall, the second side wall, and the second rear guiding member of the second guiding means together guide the wafer cassette to be precisely loaded into the interior boundary, wherein when the wafer cassette is located in the interior boundary, the wafer cassette does not move horizontally on the platform and is secured within the interior boundary by the first and second guiding means, wherein the bevelled top and side surfaces of the first front wall, the first side wall, and the first rear guiding member of the first guiding means and the bevelled top and side surfaces of the second front wall, the second side wall, and the second rear guiding member of the second guiding means automatically and precisely align the wafer cassette into the interior boundary when the first and second guiding means receive the wafer cassette.

2. The apparatus of claim 1, wherein the first guiding means further comprises a first tab and a second tab on the first base bar, wherein the first and second tabs define a first notch in between, wherein the second guiding means further comprises a third tab and a fourth tab on the second base bar, wherein the third and fourth tabs define a second notch in between.

3. The apparatus of claim 1, wherein each of the first and second rear guiding members is a conical guider.

4. The apparatus of claim 1, wherein each of the first and second rear guiding members is a dome-shaped guider.

5. The apparatus of claim 1, wherein each of the first and second rear guiding members is a pyramid-shaped guider.

* * * * *

UNITED STATES PATENT AND TRADEMARK OFFICE
CERTIFICATE OF CORRECTION

PATENT NO. : 5,246,218
DATED : September 21, 1993
INVENTOR(S) : Hoon-Yeng Yap, et al It is certified that error appears in the above-indentified patent and that said Letters Patent is hereby corrected as shown below:

Column 2, Line 7, Insert --on-- between "separately" and "platform"

Column 2, Line 16, Insert --of-- between "each" and "vertical"

Column 2, Line 30, Delete "located" Insert in place thereof --loaded--

Signed and Sealed this

Nineteenth Day of September, 1995

Attest:

BRUCE LEHMAN

Attesting Officer     Commissioner of Patents and Trademarks